United States Patent [19]

Yokote et al.

[11] Patent Number: 5,289,377
[45] Date of Patent: Feb. 22, 1994

[54] FAULT-TOLERANT SOLID-STATE FLIGHT DATA RECORDER

[75] Inventors: Timothy A. Yokote, Torrance; Eric L. Upton; Arthur G. Enyedy, both of Redondo Beach; Grant J. Stockton, Long Beach, all of Calif.

[73] Assignee: TRW Inc., Redondo Beach, Calif.

[21] Appl. No.: 744,050

[22] Filed: Aug. 12, 1991

[51] Int. Cl.⁵ .................. G06F 11/10; H03M 13/00
[52] U.S. Cl. ................ 364/424.04; 364/424.06; 364/133; 371/40.1
[58] Field of Search ............. 364/424.03, 424.04, 364/424.06, 131, 133, 134; 360/5; 371/21.1, 1, 2, 9.1, 11.1, 40.1

[56] References Cited

U.S. PATENT DOCUMENTS

| | | | |
|---|---|---|---|
| 4,409,670 | 10/1983 | Herndon et al. | 364/900 |
| 4,633,473 | 12/1986 | Ratchford et al. | 371/68 |
| 4,646,241 | 2/1987 | Ratchford et al. | 364/424.06 |
| 4,656,585 | 4/1987 | Stephenson | 364/424.06 |
| 4,682,292 | 7/1987 | Bue et al. | 360/5 |
| 4,692,923 | 9/1987 | Poeppelman | 371/2.2 |
| 4,729,102 | 3/1988 | Miller, Jr. et al. | 364/424 |
| 4,970,648 | 11/1990 | Capots | 364/424.06 |
| 5,003,541 | 3/1991 | Mester | 371/40.1 |
| 5,062,007 | 10/1991 | Nakatsu et al. | 360/29 |
| 5,140,434 | 8/1992 | Van Blessinger et al. | 360/5 |
| 5,142,540 | 8/1992 | Glasser | 371/40.1 |

Primary Examiner—Thomas G. Black
Assistant Examiner—Tan Q. Nguyen
Attorney, Agent, or Firm—Ronald L. Taylor

[57] ABSTRACT

A flight data recorder for reliable, high-speed storage of flight data employs a distributed, modular architecture in which an array of controller/memory modules is arranged in parallel controller/memory chains and the memory in the individual controller/memory modules is partitioned into submodules. This distributed architecture allows failed controller/memory modules or failed memory submodules to be bypassed, thus providing fault tolerances for both controller and memory functions. The modular architecture allows the number of controller/memory modules to be easily configured to accommodate any required storage size, while the number of parallel controller/memory chains can be configured to accommodate any required data rate.

23 Claims, 3 Drawing Sheets

FAULT-TOLERANT SOLID-STATE FLIGHT DATA RECORDER

BACKGROUND OF THE INVENTION

This invention relates generally to flight data recorders and, more particularly, to solid-state flight data recorders.

Flight data recorders are typically used in aircraft for storing flight test data and in spacecraft for storing data from various onboard instruments. Conventional magnetic tape recorders, which have been modified to withstand the adverse environments of flight and space, are widely used as flight data recorders. However, magnetic tape recorders have many moving parts and tend to breakdown frequently. Also, magnetic tape recorders have relatively low data transfer rates.

U.S. Pat. No. 4,970,648 to Capots discloses a solid-state flight data recorder in which a large array of semiconductor random access memory (RAM) chips is used for storing flight data. A central processing unit (CPU) performs the various control functions for the device. Although this solid-state device is faster and more reliable than conventional magnetic tape recorders, it does not provide the speed and reliability that is needed for today's ever increasing data transfer rates and more complex data handling requirements. Accordingly, there is still a need for a fast and reliable flight data recorder. The present invention clearly fulfills this need.

SUMMARY OF THE INVENTION

The present invention resides in a fault-tolerant solid-state flight data recorder providing reliable, high-speed storage of flight data. The flight data recorder employs a distributed, modular architecture in which an array of controller/memory modules is arranged in one or more parallel controller/memory chains and the memory in the individual controller/memory modules is partitioned into submodules. This distributed architecture allows failed controller/memory modules or failed memory submodules to be bypassed, thus providing fault tolerance for both controller and memory functions. The modular architecture allows the number of controller/memory modules to be easily configured to accommodate any required storage size, while the number of parallel controller/memory chains can be configured to accommodate any required data rate.

The fault-tolerant solid-state flight data recorder of the present invention includes, in series, a pair of parallel demultiplexers, a pair of parallel error correction encoders, one or more parallel controller/memory chains, a pair of parallel error correction decoders, and a pair of parallel multiplexers. The parallel demultiplexers and error correction encoders form redundant input channels and convert the flight data into a form that is suitable for storage in the parallel controller/memory chains. The parallel error correction decoders and multiplexers form redundant output channels and convert the data back into its original form for retrieval.

More specifically, the demultiplexers convert a high-speed, serial input data stream into a low-speed, parallel data stream suitable for storage in the controller/memory chains. After demultiplexing, the data is encoded for error correction by the error correction encoders and then stored in the controller/memory chains. Each controller/memory chain includes, in series, an input channel selector, a plurality of controller/memory modules, and an output channel selector. The input and output channel selectors switch from one input or output channel to the other input or output channel, respectively, if a failure occurs in one of the channels. The controller/memory modules in each controller/mmeory chain are arranged in parallel pairs to allow one or more failed controller/memory modules to be bypassed. When data is retrieved from the flight data recorder, the data is corrected for any errors by the error correction decoders and then multiplexed by the multiplexers to recreate the original high-speed serial data stream.

Each controller/memory module includes a controller and a memory module. The controllers perform the various control functions for the flight data recorder and the memory modules store the data in memory submodules. Each controller is connected by a data bus and a controller bus to the two controllers in the following parallel pair of controller/memory modules. This three-port architecture allows a failed controller and its controller/memory module to be bypassed.

The controllers perform five basic, sequential control functions. These control functions or modes of operation are a reset mode, a controller test mode, a memory test mode, a write mode and a read mode. The first three control functions are performed when the recorder is first turned on and ready the flight data recorder for operation. The reset mode resets or initializes the recorder's registers, the controller test mode identifies and bypasses failed or defective controllers, and the memory test mode identifies and bypasses failed or defective memory submodules. The write and read modes write data to and read data from the memory modules.

It will be appreciated from the foregoing that the present invention represents a significant advance in the field of flight data recorders. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
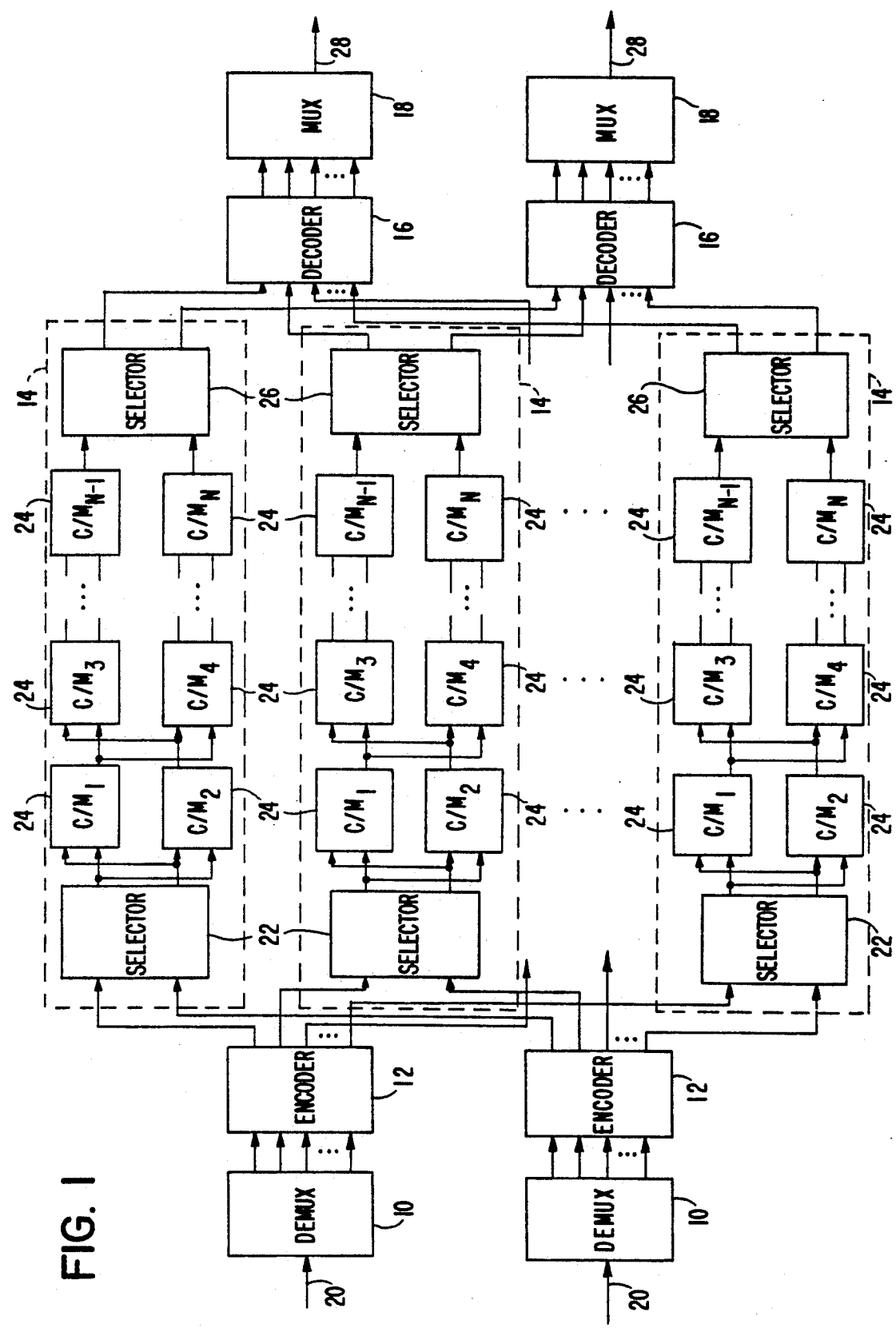
FIG. 1 is a block diagram of a fault-tolerant solid-state flight data recorder in accordance with the present invention.

As shown in the drawings for purposes of illustration, the present invention is embodied in a fault-tolerant solid-state flight data recorder providing reliable, high-speed storage of flight data. The flight data recorder employs a distributed, modular architecture in which an array of controller/memory modules is arranged in one or more parallel controller/memory chains and the memory in the individual controller/memory modules is partitioned into submodules. This distributed architecture allows failed controller/memory modules or failed memory submodules to be bypassed, thus providing fault tolerance for both controller and memory functions. This modular architecture allows the number of controller/memory modules to be easily configured to accommodate any required storage size, while the number of parallel controller/memory chains can be configured to accommodate any required data rate.

As illustrated in FIG. 1, the fault-tolerant solid-state flight data recorder of the present invention includes, in series, a pair of parallel demultiplexers 10, a pair of parallel error correction encoders 12, one or more parallel controller/memory chains 14, a pair of parallel error correction decoders 16, and a pair of parallel multiplexers 18. The parallel demultiplexers 10 and error correction encoders 12 form redundant input channels and convert the flight data into a form that is suitable for storage in the parallel controller/memory chains 14. The parallel error correction decoders 16 and multiplexers 18 form redundant output channels and convert the data back into its original form for retrieval.

More specifically, the demultiplexers 10 convert a high-speed, serial input data stream, on line 20, into a low-speed, parallel data stream suitable for storage in the controller/memory chains 14. After demultiplexing, the data is encoded for error correction by the error correction encoders 12 and then stored in the controller/memory chains 14. Each controller/memory chain 14 includes, in series, an input channel selector 22, a plurality of controller/memory modules 24 ($C/M_1$ through $C/M_N$), and an output channel selector 26. The input and output channel selectors 22, 26 switch from one input or output channel to the other input or output channel, respectively, if a failure occurs in one of the channels. The controller/memory modules 24 in each controller/memory chain 14 are arranged in parallel pairs to allow one or more failed controller/memory modules 24 to be bypassed. When data is retrieved from the flight data recorder, the data is corrected for any errors by the error correction decoders 16 and then multiplexed by the multiplexers 18 to recreate, on line 28, the original high-speed serial data stream.

Figure 2:
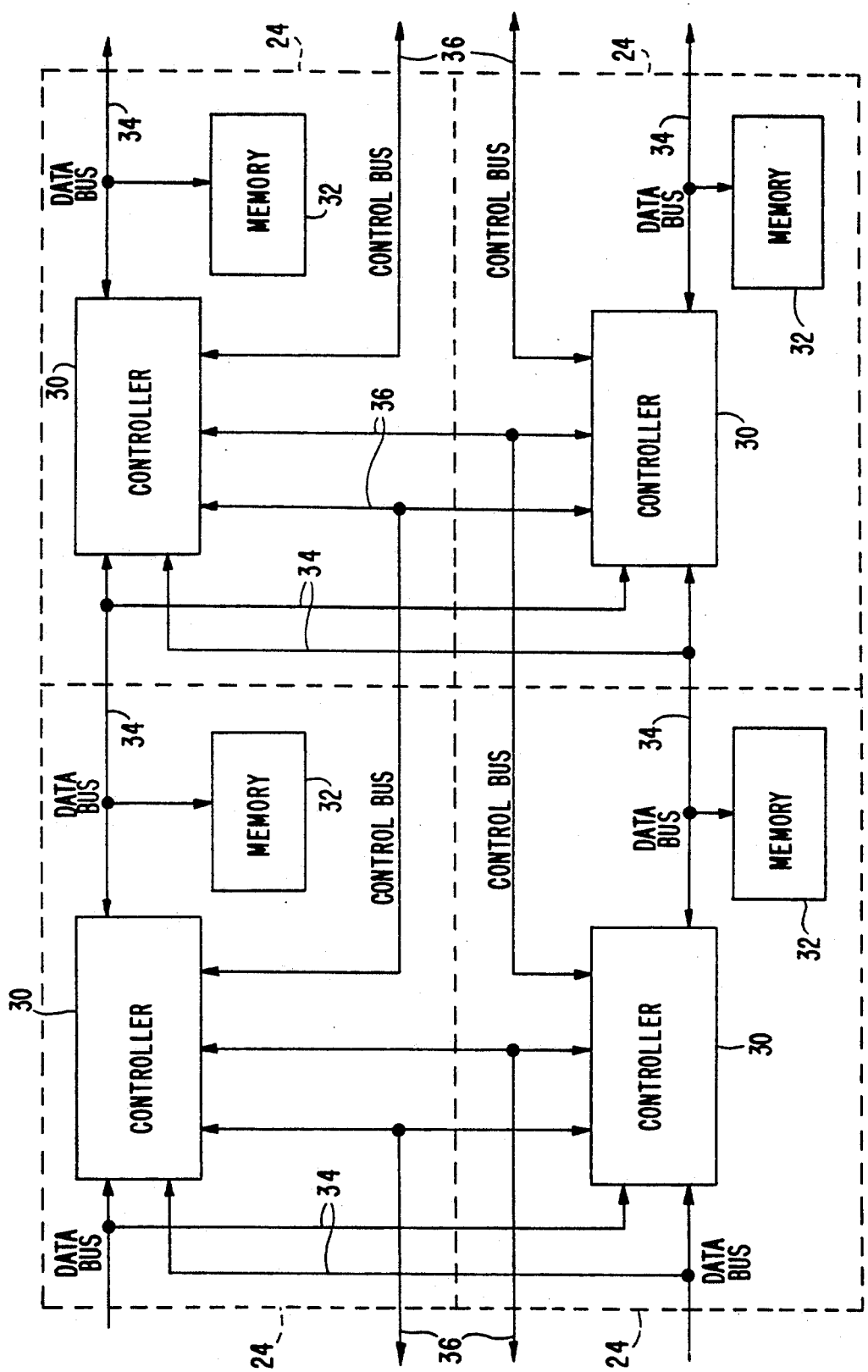
FIG. 2 is a block diagram showing the interconnections between controller/memory modules.
Figure 3:
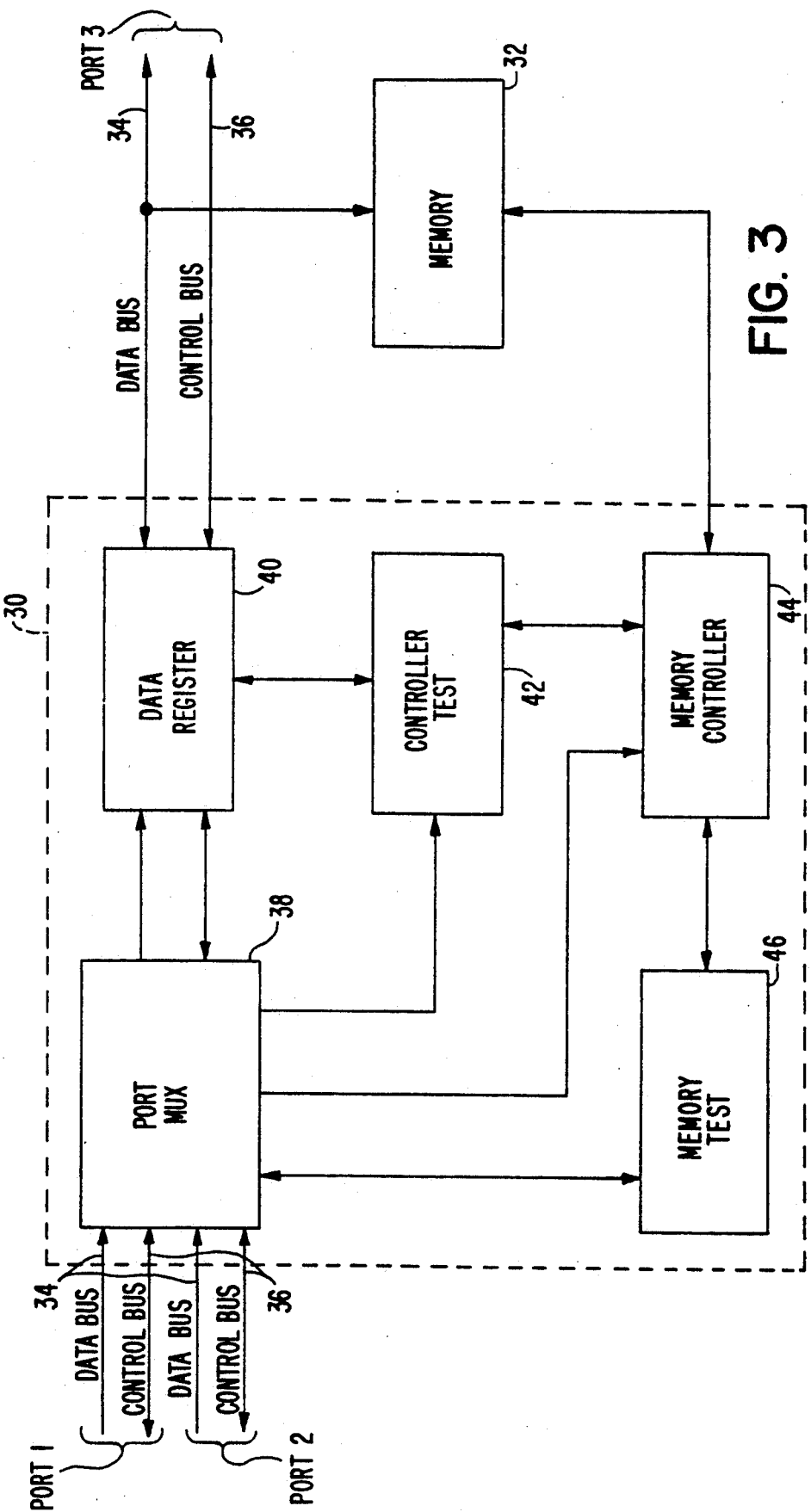
FIG. 3 is a block diagram of a controller/memory module.

As illustrated in FIG. 2, each controller/memory module 24 includes a controller 30 and a memory module 32. The controllers 30 perform the various control functions for the flight data recorder and the memory modules 32 store the data in memory submodules. Each controller 30 is connected by a data bus 34 and a controller bus 36 to the two controllers 30 in the following parallel pair of controller/memory modules 24. This three-port architecture, as illustrated in FIG. 3, allows a failed controller 30 and its controller/memory module 24 to be bypassed. The data bus 34 also connects the controller 30 to the memory module 32.

The controllers 30 perform five basic, sequential control functions. These control functions or modes of operation are a reset mode, a controller test mode, a memory test mode, a write mode and a read mode. The first three control functions are performed when the recorder is first turned on and ready the flight data recorder for operation. The reset mode resets o initializes the recorder's registers, the controller test mode identifies and bypasses failed or defective controllers 30, and the memory test mode identifies and bypasses failed or defective memory submodules. The write and read modes write data to and read data from the memory modules 32.

As illustrated in FIG. 3, each controller 30 includes a port multiplexer 38, a data register 40, controller test means 42, a memory controller 44, and memory test means 46. The port multiplexer 38 receives data and control signals on the data and control buses 34, 36, respectively, from a controller 30 in the preceding parallel pair of controller/memory modules 24 that has been predesignated as the active controller. However, if this designated controller 30 has failed the controller test, the other controller 30 in the preceding parallel pair of controller/memory modules 24 is the designated controller and the port multiplexer 38 receives the data and control signals from this controller. The data register 40 is a buffer for temporarily storing data and control signals before they are sent on to the following controller/memory modules 24 or for temporarily storing data before it is written to or after it is read from the memory module 32. The data register 40 is reset by the reset mode.

The controller test means 42 in the designated controller 30 performs the controller test on the two controllers 30 in the following parallel pair of controller/memory modules 24. The controller test means 42 generates a test pattern and applies the pattern to the two controllers 30. The controller test means 42 then reads back the test pattern to verify that all of the controllers' registers and gates are working properly.

The memory module 32 is preferably an array of semiconductor random access memory (RAM) chips, such as static RAM's (SRAM's) or dynamic RAM'S (DRAM's), arranged in submodules. The memory controller 44 controls and addresses the RAM chips for the read/write operations, and refreshes the DRAM's. The memory test means 46 performs the memory test on the RAM chips by writing known data patterns to the chips and then reading back the patterns from the chips. The RAM chips are arranged in submodules so that an entire memory module 32 is not removed from use if it is found defective. A submodule is found defective only if the number of errors exceeds some preset threshold.

In each controller/memory chain 14, data is written to controller/memory module $C/M_1$ first, then $C/M_2$, $C/M_3$, $C/M_4$, and so on, until controller/memory modules $C/M_{N-1}$ and $C/M_N$ are filled. Data is retrieved from the controller/memory modules 24 in the same order, thereby providing first in, first out (FIFO) operation. Only one controller/memory module 24 in a controller/memory chain 14 reads or writes data to memory at a time, thus greatly reducing power consumption. However, other controller/memory modules 24 can be passing data or refreshing their DRAM's.

The number of parallel controller/memory chains 14 depends largely on the speed of the incoming data, while the number of controller/memory modules 24 in each chain 14 depends largely on the amount of data to be stored. However, there is a trade-off involved in selecting the amount of memory per controller/memory module 24. If a large amount of memory is chosen per controller/memory module 24, there are fewer modules 24 and data can be clocked through them at a faster rate, but the amount of memory taken out of use is large if a controller 30 is found to be defective.

In a preferred embodiment of the present invention, the flight data recorder includes four parallel controller/memory chains 14 and a 200 Mbits/sec input data rate. The 200 Mbits/sec input data rate is demultiplexed at a rate of 1:64, transforming the high-speed serial input channel into 64 parallel channels at 3.125 Mbits/sec. No error correction is applied and each controller/memory chain 14 receives 16 bits. The 16 bits are stored in memory modules of 16 4×1024K DRAM's, which are grouped into 4 submodules. When the data is retrieved from the flight data recorder, the data is multiplexed at a rate of 64:1 to recreate the original 200 Mbits/sec serial data stream.

From the foregoing, it will be appreciated that the present invention represents a significant advance in the field of flight data recorders. Although a preferred embodiment of the invention has been shown and described, it will be apparent that other adaptations and modifications can be made without departing from the spirit and scope of the invention. For example, one modification is to use dual data buses, thereby allowing for simultaneous read and write operations. Accordingly, the invention is not to be limited, except as by the following claims.

We claim:

1. A fault-tolerant flight data recorder, comprising:
   a demultiplexer for converting a serial input data stream into a parallel data stream;
   a distributed array of controller/memory modules arranged in one or more parallel controller/memory chains for storing the parallel data stream, the controller/memory modules being arranged in parallel pairs in each controller/memory chain, the memory in each controller/memory module being partitioned into memory submodules to allow failed controller/memory modules or failed memory submodules to be bypassed to provide fault tolerance for both controller and memory functions; and
   a multiplexer for converting the parallel data stream from the controller/memory chains into a serial output data stream when the parallel data stream is retrieved from the flight data recorder.

2. The fault-tolerant flight data recorder as set forth in claim 1, and further including:
   an error correction encoder for encoding the data for error correction before storage in the controller/memory chains; and
   an error correction decoder for correcting the data for any errors when the data is retrieved from the flight data recorder.

3. The fault-tolerant flight data recorder as set forth in claim 2, wherein the demultiplexer and the error correction encoder include a pair of parallel demultiplexers and a pair of parallel error correction encoders to provide redundant input channels.

4. The fault-tolerant flight data recorder as set forth in claim 2, wherein the multiplexer and the error correction decoder include a pair of parallel multiplexers and a pair of parallel error correction decoders to provide redundant output channels.

5. The fault-tolerant flight data recorder as set forth in claim 3, wherein each controller/memory chain includes an input channel selector for switching from one input channel to the other if a failure occurs in one input channel.

6. The fault-tolerant flight data recorder as set forth in claim 4, wherein each controller/memory chain includes an output channel selector for switching from one output channel to the other if a failure occurs in one output channel.

7. The fault-tolerant flight data recorder as set forth in claim 1, wherein each controller/memory module includes:
   a controller for performing various control functions for the flight data recorder.

8. The fault-tolerant flight data recorder as set forth in claim 7, wherein the controller in each controller/memory module is connected by a data bus and a controller bus to the two controllers in the following parallel pair of controller/memory modules.

9. The fault-tolerant flight data recorder as set forth in claim 8, wherein the controllers perform five basic control functions, the five basic control functions being a reset mode, a controller test mode for identifying and bypassing failed controllers, a memory test mode for ing parallel pair of controller/memory modules.

10. The fault-tolerant flight data recorder as set forth in claim 9, wherein each controller includes:
    a port multiplexer for receiving data and control signals on the data and control buses from a designated controller in the preceding parallel pair of controller/memory modules;
    a data register for temporarily storing data and control signals;
    controller test means for performing the controller test on the two controllers in the following parallel pair of controller/memory modules;
    a memory controller for controlling and addressing the memory module; and
    memory test means for performing the memory test on the memory submodules, a memory submodule being found defective only if the number of errors exceeds some preset threshold.

11. A fault-tolerant data recorder, comprising:
    one or more parallel controller/memory chains for storing data, the controller/memory modules being arranged in parallel pairs in each controller/memory chain, each controller/memory chain having a distributed array of controller/memory modules to allow failed controller/memory modules to be bypassed to provide fault tolerance for both controller and memory functions.

12. The fault-tolerant data recorder as set forth in claim 11, and further including:
    a demultiplexer for converting a serial input data stream into a parallel data stream for storage in the controller/memory chains; and
    a multiplexer for converting the parallel data stream from the controller/memory chains into a serial output data stream when the data is retrieved from the data recorder.

13. The fault-tolerant data recorder as set forth in claim 12, and further including:
    an error correction encoder for encoding the data for error correction before storage in the controller/memory chains; and
    an error correction decoder for correcting the data for any errors when the data is retrieved from the data recorder.

14. The fault-tolerant data recorder as set forth in claim 12, wherein each controller/memory module includes:
    a controller for performing various control functions for the data recorder; and
    a memory module partitioned into submodules for storing the data.

15. The fault-tolerant data recorder as set forth in claim 14, wherein the controller in each controller/memory module is connected by a data bus and a controller bus to the two controllers in the following parallel pair of controller/memory modules.

16. The fault-tolerant data recorder as set forth in claim 15, wherein the controllers perform five basic control functions, the control functions or modes of operation being a reset mode, a controller test mode for identifying and bypassing failed controllers, a memory test mode for identifying and bypassing failed memory submodules, a write mode and a read mode.

17. The fault-tolerant data recorder as set forth in claim 16, wherein each controller includes:
   a port multiplexer for receiving data and control signals on the data and control buses from a designated controller in the preceding parallel pair of controller/memory modules;
   a data register for temporarily storing data and control signals;
   controller test means for performing the controller test on the two controllers in the following parallel pair of controller/memory modules;
   a memory controller for controlling and addressing the memory module; and
   memory test means for performing the memory test on the memory submodules, a memory submodule being found defective only if the number of errors exceeds some preset threshold.

18. A fault-tolerant method for storing data, comprising the step of:
   storing data in one or more parallel controller/memory chains, the controller/memory modules being arranged in parallel pairs in each controller/memory chain, each controller/memory chain having a distributed array of controller/memory modules in which failed controller/memory modules are bypassed to provide fault tolerance for both controller and memory.

19. The fault-tolerant data storage method as set forth in claim 18, and further including the steps of:
   converting a serial input data stream into a parallel data stream for storage in the controller/memory chains; and
   converting the parallel data stream from the controller/memory chains into a serial output data stream when the data is retrieved from the data recorder.

20. The fault-tolerant data storage method as set forth in claim 19, and further including the steps of:
   encoding the data for error correction before storage in the controller/memory chains; and
   correcting the data for any errors when the data is retrieved from the data recorder.

21. The fault-tolerant data storage method as set forth in claim 18, wherein each controller/memory module includes a controller for performing various control functions for the data recorder and a memory module partitioned into submodules for storing the data.

22. The fault-tolerant data storage method as set forth in claim 21, wherein the controller in each controller/memory module is connected by a data bus and a controller bus to the two controllers in the following parallel pair of controller/memory modules.

23. The fault-tolerant data storage method as set forth in claim 22, wherein the controllers perform five basic control functions, the control functions or modes of operation being a reset mode, a controller test mode for identifying and bypassing failed controllers, a memory test mode for identifying and bypassing failed memory submodules, a write mode and a read mode.

* * * * *